(12) United States Patent
Koga et al.

(10) Patent No.: US 6,825,867 B2
(45) Date of Patent: Nov. 30, 2004

(54) ORGANIC ELECTROLUMINESCENT ARRAY EXPOSURE HEAD, METHOD OF FABRICATING THE SAME, AND IMAGE FORMING APPARATUS USING THE SAME

(75) Inventors: Yoshiro Koga, Nagano-Ken (JP); Yujiro Nomura, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/189,764

(22) Filed: Jul. 8, 2002

(65) Prior Publication Data

US 2003/0020799 A1 Jan. 30, 2003

(30) Foreign Application Priority Data

Jul. 9, 2001 (JP) ........................................ 2001-208076

(51) Int. Cl.[7] .............................. B41J 2/45; B41J 2/385
(52) U.S. Cl. ........................................ 347/238; 347/130
(58) Field of Search ................................. 347/130, 238, 347/241, 244, 256, 258, 137; 428/209; 359/619

(56) References Cited

U.S. PATENT DOCUMENTS

| 5,337,074 | A |   | 8/1994 | Thornton ..................... 347/237 |
| 5,855,994 | A | * | 1/1999 | Biebuyck et al. ............ 428/209 |
| 6,133,933 | A | * | 10/2000 | Paoli ........................... 347/238 |
| 6,137,523 | A |   | 10/2000 | Fork ........................... 347/237 |
| 6,480,212 | B1 | * | 11/2002 | Shimoda et al. ............ 347/129 |
| 2003/0093742 | A1 | * | 7/2003 | Miyamae et al. ........... 359/619 |

FOREIGN PATENT DOCUMENTS

| EP | 0 779 160 A2 | 6/1997 |
| EP | 0 838 715 A1 | 4/1998 |
| JP | 10-12377 | 1/1988 |
| JP | 6-202242 | 7/1994 |
| JP | 7-40593 | 2/1995 |
| JP | 10-55890 | 2/1998 |
| JP | 11-142608 | * 5/1999 ............ G02B/3/00 |
| JP | 11-198433 | 7/1999 |
| JP | 2000-77188 | 3/2000 |
| JP | 2000-077188 A | 3/2000 |
| JP | 2000-323276 | 11/2000 |
| JP | 2001-18441 | 1/2001 |
| JP | 2001-091877 A | 4/2001 |

OTHER PUBLICATIONS

Biehl s et al., "Refractive Microlens Fabrication by ink–jet Process" Journal of Sol–gel Science and Technology, Kluwer Academic Publishers, Dordrecht, NL, vol. 13, No. 1–3, 1998, pp. 177–182, *the whole document.
Microjet Fabrication of Microlens Arrays, MacFarlane et al, Sep. 1, 1994, 8342 IEEE Photonics Technology Letters.
Ink–Jet Fabrication of Polymer Microlens for Optical–I/O Chip Packaging, Ishii et al, Nov. 15, 1999 Japanese J. Appln. vol. 39 (2000) pp. 1490–1493.

* cited by examiner

*Primary Examiner*—Hai Pham
(74) *Attorney, Agent, or Firm*—Sughrue Mion, PLLC

(57) ABSTRACT

An organic EL array exposure head integrated with microlenses for converging or diverging light from light-emitting parts is disclosed, together with a method of fabricating the exposure head and an image forming apparatus using the same. The organic EL array exposure head has an array of organic EL light-emitting parts arranged in the form of at least one row of pixels on a substrate of continuous length. A microlens formed by ink-jet printing is provided over a surface of each organic EL light-emitting part at a side thereof remote from the substrate.

13 Claims, 7 Drawing Sheets

ORGANIC ELECTROLUMINESCENT ARRAY EXPOSURE HEAD, METHOD OF FABRICATING THE SAME, AND IMAGE FORMING APPARATUS USING THE SAME

BACKGROUND OF THE INVENTION

The present invention relates to an organic electroluminescent (hereinafter abbreviated as "EL") array exposure head and a method of fabricating the same and also pertains to an image forming apparatus using the same. More particularly, the present invention relates to an organic EL array exposure head integrated with image-forming lenses and a method of fabricating the same and also pertains to an image forming apparatus using the same.

Various techniques of using an organic EL array as an exposure head for image forming apparatus have heretofore been proposed. Those concerned therewith are as follows.

In Japanese Patent Application Unexamined Publication Number [hereinafter referred to as "JP(A)"] Hei 10-55890, the whole organic EL array is fabricated on an insulating substrate, e.g. glass, and a separate driver IC is combined with the organic EL array. A converging rod lens array is used to image the light-emitting parts of the organic EL array onto a photosensitive drum.

JP(A) Hei 11-198433 uses a one-chip organic EL array having a plurality of rows of light-emitting parts. However, the optical system for imaging the light-emitting parts onto a photosensitive drum is not clear. It should be noted that an EL layer of the organic EL array is deposited by evaporation.

In JP(A) 2000-77188, microlenses are formed on the top surface of a substrate by an ion exchange method. Alternatively, microlenses are formed on the bottom surface of a substrate by a method using a photoresist or by a replica method. An organic EL array having a resonator structure is deposited in alignment with the microlenses by evaporation.

JP(A) Hei 10-12377 relates to a method of producing an active matrix organic EL display. An organic light-emitting layer is formed by ink-jet printing over a glass substrate having thin-film transistors.

In JP(A) 2000-323276, a hole injection layer and an organic light-emitting layer of an organic EL element are formed by coating using ink-jet printing with a partition wall provided therearound.

In JP(A) 2001-18441, a light-emitting layer and a TFT layer for controlling light emission therefrom are formed in a photosensitive drum to construct a printer.

When an organic EL array is used as an exposure head of a printer, e.g. an electrophotographic printer, in the above-described prior art, JP(A) Hei 10-55890 and Hei 11-198433 need to use a separate optical system. This causes the apparatus to increase in size and cost unavoidably. JP(A) 2000-77188, in which the organic EL array is integrated with microlenses, suffers problems such as a restriction in usable microlens materials. Further, these conventional techniques involve problems such as a narrow selectivity of materials for the EL layer because it is formed by evaporation.

SUMMARY OF THE INVENTION

The present invention was made in view of the above-described problems with the prior art.

An object of the present invention is to provide an organic EL array exposure head integrated with microlenses for converging or diverging light from light-emitting parts, together with a method of fabricating the organic EL array exposure head and an image forming apparatus using the same.

To attain the above-described object, the present invention provides an organic EL array exposure head including an array of organic EL light-emitting parts arranged in the form of at least one row of pixels on a substrate of continuous length. The organic EL array exposure head further includes a microlens formed by ink-jet printing over a surface of each organic EL light-emitting part at a side thereof remote from the substrate.

In this case, it is desirable that the organic EL light-emitting parts should be formed in respective discrete holes divided from each other by a partition wall provided on the substrate, and the microlens should be formed over each of the organic EL light-emitting parts in the holes.

It is also desirable that a thin-film electronic circuit for controlling light emission from the organic EL light-emitting parts should be formed on the substrate, and the organic EL light-emitting parts should be provided over the thin-film electronic circuit.

An organic light-emitting layer and a hole injection layer constituting the organic EL light-emitting parts may also be formed by ink-jet printing.

It is desirable that the microlens should be a convex lens.

In addition, the present invention provides a method of fabricating an organic EL array exposure head. According to the fabrication method, reflector electrodes are formed in the form of at least one row of pixels on a substrate of continuous length. Each reflector electrode constitutes one electrode of each organic EL light-emitting part.

Then, a partition wall of a predetermined height is formed over the reflector electrodes. The partition wall has discrete holes corresponding to the reflector electrodes. Then, an organic light-emitting layer or a hole injection layer constituting each organic EL light-emitting part is formed in each hole in the partition wall by ink-jet printing.

Then, a hole injection layer or an organic light-emitting layer constituting each organic EL light-emitting part is formed in each hole in the partition wall by ink-jet printing.

Then, a transparent electrode is formed uniformly over a surface of the substrate as the other electrode of each organic EL light-emitting part.

Thereafter, a microlens is formed over the transparent electrode in each hole in the partition wall by ink-jet printing.

In this case, after the formation of the transparent electrode, a surface thereof may be treated to be water repellent so that a convex lens is formed thereon as a microlens. Alternatively, the surface of the transparent electrode may be treated to be hydrophilic so that a concave lens is formed thereon as a microlens.

It is desirable that prior to the formation of the reflector electrodes, a thin-film electronic circuit for controlling light emission from the organic EL light-emitting parts should be formed on the substrate.

The present invention includes image forming apparatus having the above-described organic EL array exposure head as an exposure head for writing an image on an image carrier. One example is a tandem color image forming apparatus including at least two image forming stations each having an electric charging device, an exposure head, a developing device, and a transfer device around an image carrier, wherein a transfer medium passes through the stations to perform color image formation.

Thus, the organic EL array exposure head according to the present invention has an array of organic EL light-emitting parts arranged in the form of at least one row of pixels on a substrate of continuous length. The organic EL array exposure head further has a microlens formed by ink-jet printing over a surface of each organic EL light-emitting part at a side thereof remote from the substrate. Accordingly, it is possible to readily provide a low-cost exposure head for use in electrophotographic printers, etc. that suffers minimal unevenness of exposure and has a simplified arrangement requiring no separate optical system.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

An embodiment of an organic EL array exposure head according to the present invention will be described below on the basis of a method of fabricating the same.

Figure 1:
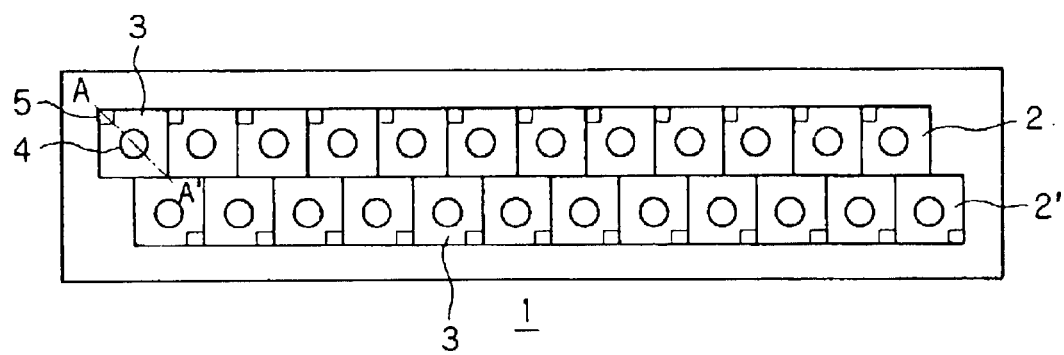
FIG. 1 is a schematic plan view of an embodiment of an organic EL array exposure head according to the present invention.
Figure 2:
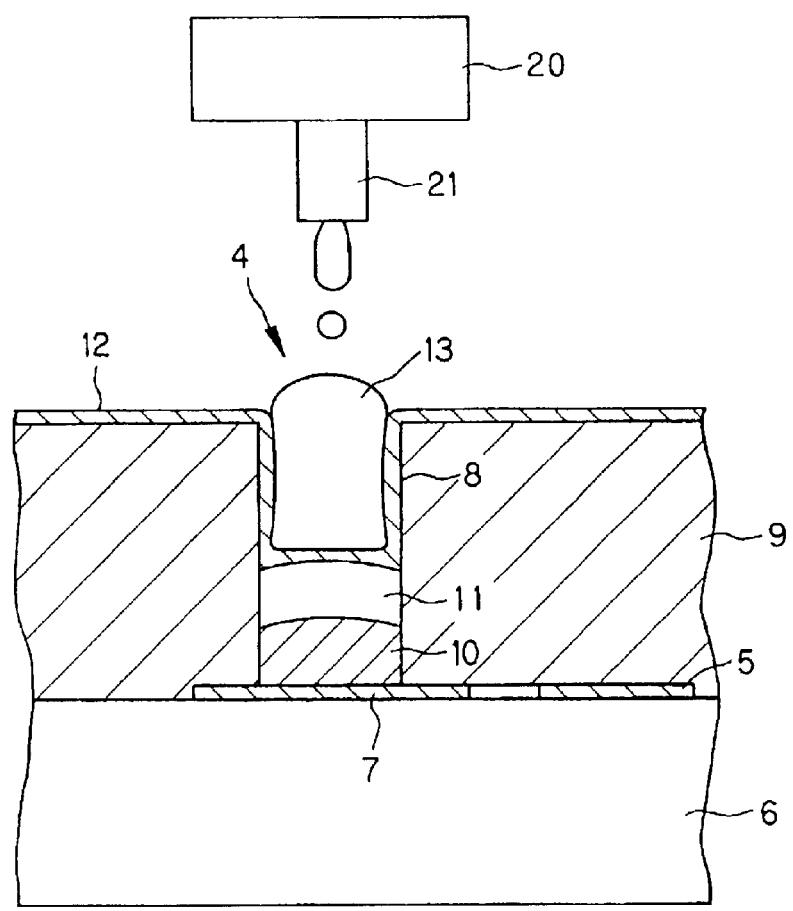
FIG. 2 is a sectional view of one pixel in an array shown in FIG. 1.

FIG. 1 is a schematic plan view of an embodiment of an organic EL array exposure head according to the present invention. FIG. 2 is a sectional view of one pixel in an array taken along the straight line A-A' in FIG. 1.

The organic EL array exposure head 1 in this embodiment has two parallel arrays 2 and 2' of staggered pixels 3. The arrays 2 and 2' each comprises a large number of pixels 3 arranged in a straight-line form. Each pixel 3 has the same structure formed from an organic EL light-emitting part 4 and a TFT 5 for controlling light emission from the organic EL light-emitting part 4.

FIG. 2 is a sectional view showing one pixel 3, including an organic EL light-emitting part 4 and a TFT 5. The organic EL array exposure head 1 will be described below in the order of the fabrication sequence. First, TFT's 5 are fabricated on a glass substrate 6. Various methods of making TFT's 5 are known. For example, a silicon oxide film is deposited on the glass substrate 6 first. Then, an amorphous silicon film is deposited thereon. Next, the amorphous silicon film is irradiated with an excimer laser beam for crystallization to form a polysilicon film serving as a channel. After the polysilicon film has been patterned, a gate insulator is deposited thereover. Then, a gate electrode made of tantalum nitride is formed. Subsequently, source and drain regions of n-channel TFT's are formed by ion implantation of phosphorous, and source and drain regions of p-channel TFT's are formed by ion implantation of boron. After the ion-implanted impurities have been activated, the following fabrication steps are carried out successively: deposition of a first interlayer insulator; opening of first contact holes; formation of source wires; deposition of a second interlayer insulator; opening of second contact holes; and formation of metallic pixel electrodes. In this way, an array of TFT's 5 is completed [see, for example, "Polymer EL Display", The 8th Electronic Display Forum (Apr. 18, 2001)]. It should be noted that each metallic pixel electrode serves as a cathode 7 of each organic EL light-emitting part 4, and also serves as a reflector layer of the organic EL light-emitting part 4. The pixel electrodes are formed from metallic thin-film electrodes of Mg, Ag, Al, Li, etc.

Next, a partition wall (bank) 9 of a predetermined height is formed. The partition wall 9 has a hole 8 corresponding to each organic EL light-emitting part 4. The partition wall 9 can be made by a desired method, e.g. photolithography, or printing, as disclosed in JP(A) 2000-353594. When a lithography process is used, for example, an organic material is applied to the substrate surface to the height of the bank to be made by a predetermined method, e.g. spin coating, spray coating, roll coating, die coating, or dip coating, and a resist layer is applied to the surface of the applied organic material. The resist is exposed through a mask having a pattern corresponding to the configuration of the partition wall 9 to be made, and then developed, thereby allowing the resist to remain in a pattern corresponding to the configuration of the partition wall 9. Finally, the partition material is etched to remove the material from the area except the masked regions. It is also possible to form a bank (projection) comprising two or more layers, of which a lower layer is made of an inorganic material, and an upper layer is an organic material layer. JP(A) 2000-323276 discloses that the constituent material of the partition wall 9 is preferably an organic material, e.g. an acrylic resin, an epoxy resin, or a photosensitive polyimide, because these materials can be formed into Teflon by fluorocarbon gas plasma treatment, although there is no particular restriction on the material of the partition wall 9, provided that the material used has durability with respect to a solvent used in the EL material. It is also possible to use a stacked partition structure having a lower layer made of an inorganic material, e.g. liquid glass. It is desirable that the partition wall 9 should be made black or opaque by mixing the above-described material with carbon black or the like. It becomes possible by making the partition wall 9 opaque to prevent crosstalk in which undesired light enters a neighboring pixel position.

Immediately before the application of an ink composition for forming an organic EL light-emitting layer, the substrate 6 provided with the partition wall 9 is subjected to continuous plasma treatment with oxygen gas and fluorocarbon gas plasma. By doing so, the surface of the polyimide constituting the partition wall 9 is made water repellent, for example, whereas the surface of the cathode 7 is made hydrophilic. Thus, it is possible to control the wettability of the substrate side for finely patterning ink-jet drops. As a plasma-generating apparatus, it is possible to use either an apparatus that generates a plasma in a vacuum or an apparatus generating a plasma in the atmosphere.

Next, an ink composition for forming a light-emitting layer is jetted from a head 21 of an ink-jet printing apparatus 20 into each hole 8 in the partition wall 9 to apply a patterned coating to the surface of the cathode 7 of each pixel. After the coating process, the solvent is removed, and heat treatment is performed to form a light-emitting layer 10.

Figure 3:
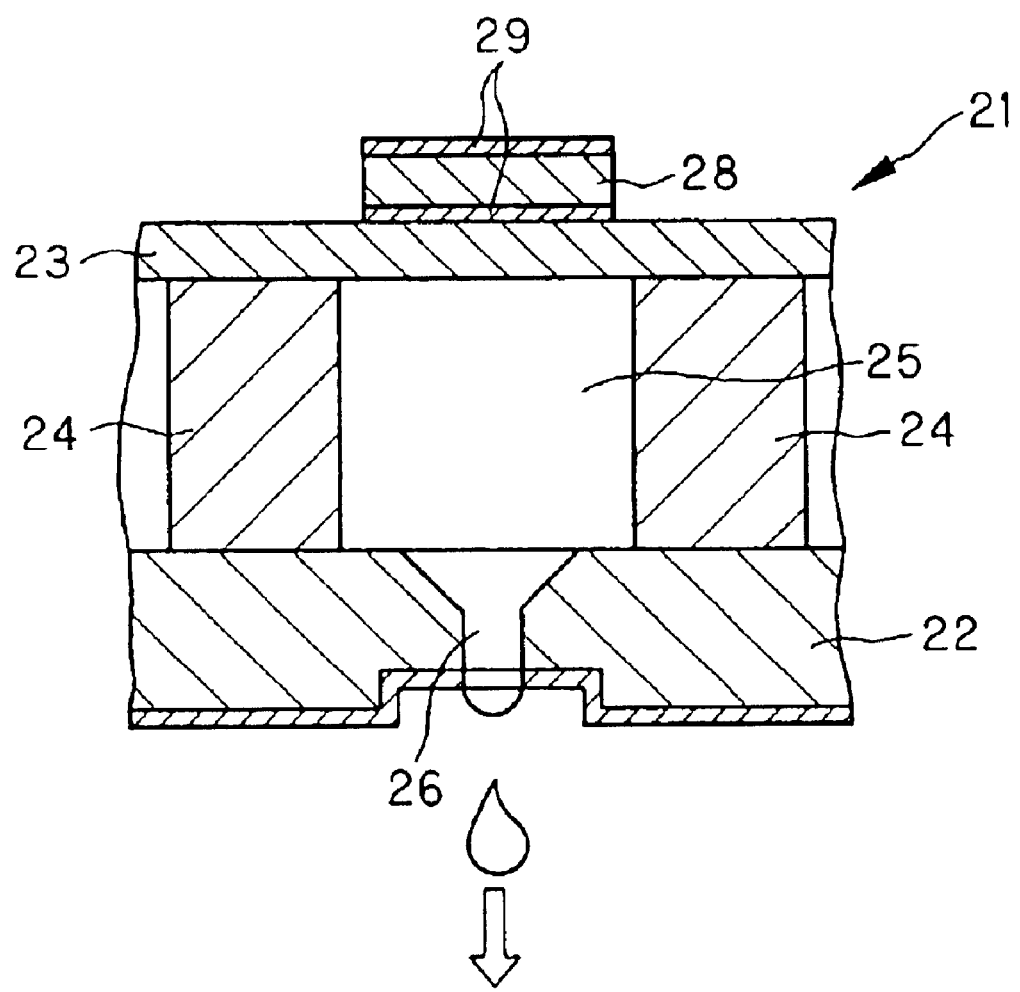
FIG. 3 is a diagram showing a structural example of a piezo ink-jet printing head among ink-jet printing heads.

The term "ink-jet printing" as used in the present invention means to include the following printing processes: piezo ink-jet printing in which an ink composition is jetted out by using the mechanical energy of a piezoelectric element or the like; and thermal ink-jet printing in which an air bubble is generated by using the heat energy of a heater, and an ink composition is jetted out on the basis of the generation of the air bubble ("Fine Imaging and Hardcopy", page 43, edited by Joint Publishing Committee between The Society of Photographic Science and Technology of Japan and The Imaging Society of Japan, published on Jan. 7, 1999 by Corona Publishing Co., Ltd.). A structural example of a head used in piezo ink-jet printing is shown in FIG. 3. An ink-jet head 21 has a nozzle plate 22 and a diaphragm 23, which are made of stainless steel, for example. The nozzle plate 22 and the diaphragm 23 are joined together through partition members (reservoir plates) 24. Between the nozzle plate 22 and the diaphragm 23, a plurality of ink chambers 25 and reservoirs (not shown) are formed by the partition members 24. The interiors of the ink chambers 25 and the reservoirs are filled with an ink composition. The ink chambers 25 and the reservoirs communicate with each other through respective supply ports. Further, the nozzle plate 22 is provided with nozzle openings 26 for spraying the ink composition from the ink chambers 25 in the form of jets. The ink-jet head 21 is formed with an ink inlet for supplying the ink composition to each reservoir. Piezoelectric elements 28 are joined to a surface of the diaphragm 23 opposite to a surface thereof facing the ink chambers 25 at respective positions corresponding to the ink chambers 25. Each piezoelectric element 28 is positioned between a pair of electrodes 29. When energized, the piezoelectric element 28 is distorted so as to project outwardly. This causes the ink chamber 25 to increase in volume. Consequently, an amount of ink composition corresponding to the increase in volume of the ink chamber 25 flows thereinto from the reservoir through the supply port. When deenergized, the piezoelectric element 28 returns to its previous shape, together with the diaphragm 23. Consequently, the ink chamber 25 also returns to its previous volume. Therefore, the pressure of the ink composition in the ink chamber 25 increases, causing the ink composition to jet out from the nozzle opening 26 toward the substrate 6 provided with the partition wall 9.

After the formation of the light-emitting layer 10 in the hole 8, an ink composition for forming a hole injection layer is jetted from the head 21 of the ink-jet printing apparatus 20 onto the light-emitting layer 10 in each hole 8 to apply a patterned coating to the surface of the light-emitting layer 10 of each pixel. After the coating process, the solvent is removed, and heat treatment is performed to form a hole injection layer 11.

It should be noted that the order in which the light-emitting layer 10 and the hole injection layer 11 are stacked may be reverse to the above. It is desirable that a layer more resistant to water should be disposed closer to the surface side (i.e. more away from the substrate 6).

The light-emitting layer 10 and the hole injection layer 11 can also be formed by a publicly known spin coating, dipping or evaporation method instead of applying the ink compositions by ink-jet printing as stated above.

Regarding materials used to form the light-emitting layer 10 and the hole injection layer 11, it is possible to use various publicly known materials, for example, those disclosed in JP(A) Hei-10-12377 and 2000-323276. A detailed description thereof is omitted herein.

After the light-emitting layer 10 and the hole injection layer 11 have been successively formed in each hole 8 of the partition wall 9, a transparent electrode 12 is deposited over the whole surface of the substrate 6 by vacuum evaporation to form an anode of the organic EL array. Examples of materials usable as the transparent electrode 12 include a tin oxide film, an ITO film, and a composite oxide film of indium oxide and zinc oxide. It is possible to use photolithography, sputtering or pyrosol process, for example, in addition to vacuum evaporation. With such a process, the transparent electrode 12 is formed over the top surface of the partition wall 9 and the inner surface of each hole 8.

Next, the surface of the transparent electrode 12 is treated to be water repellent. Then, a transparent ink composition for forming a microlens is jetted from the head 21 of the ink-jet printing apparatus 20 into each hole 8 of the partition wall 9 to apply a patterned coating. After the coating process, the applied ink composition is cured to form a convex microlens 13 over the organic EL light-emitting part 4 of each pixel. The curvature radius of the surface of the convex microlens 13, i.e. the focal length, is determined by the amount of ink composition jetted from the printer head 21, the diameter of the hole 8, the surface tension of the microlens-forming transparent ink composition, the degree of water repellency imparted to the transparent electrode 12, the rate of shrinkage of the ink composition when cured, etc.

Figure 4:
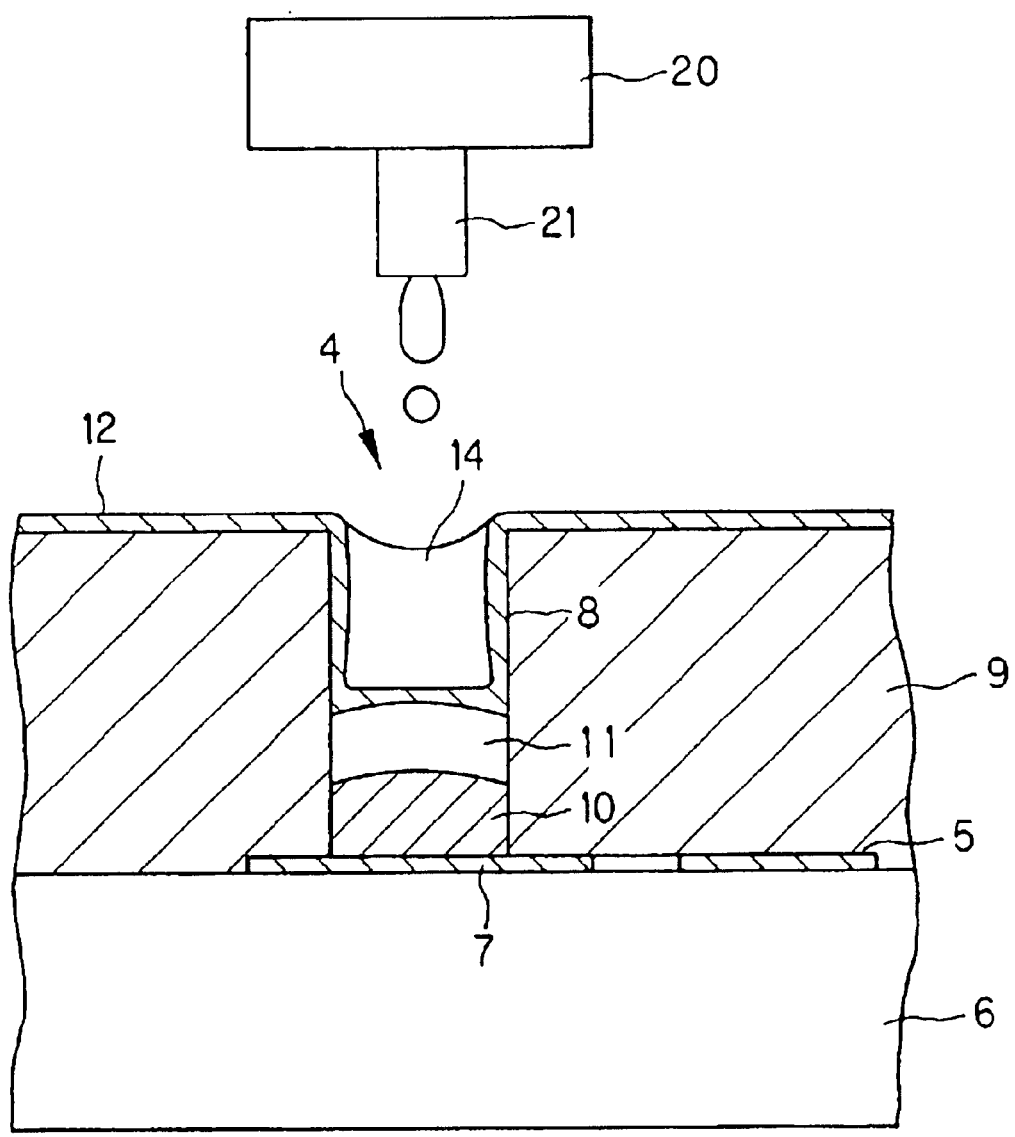
FIG. 4 is a sectional view of one pixel in an array in which a concave microlens is formed over an organic EL light-emitting part of each pixel.

It should be noted that a concave microlens 14 can be formed over the organic EL light-emitting part 4 of each pixel, as shown in FIG. 4, by applying a patterned coating of a transparent ink composition in the same way as the above after the surface of the transparent electrode 12 has been treated to be hydrophilic.

Figure 5A:
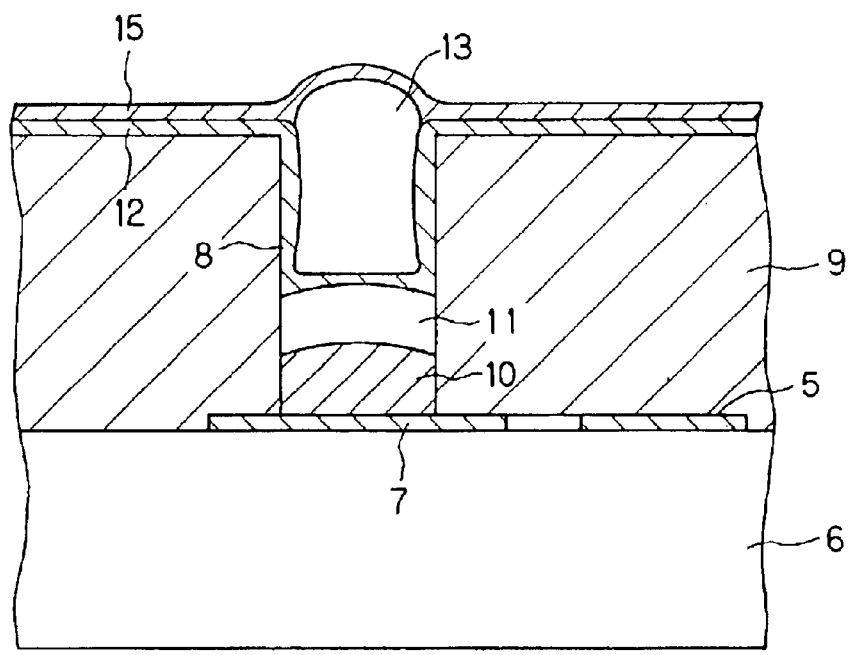
FIGS. 5(a) and 5(b) are sectional views of examples of a structure for preventing the entry of water.

Incidentally, the organic EL light-emitting part 4 comprising the cathode 7, the light-emitting layer 10, the hole injection layer 11 and the transparent electrode (anode) 12 is easily deteriorated by water. Therefore, it is desirable that, as shown in FIG. 5(a), a transparent protective layer 15 should be applied to the whole surface of the substrate after the formation of the microlenses 13 or 14 to prevent the entry of water. Examples of materials usable for the transparent protective layer 15 include an epoxy resin, an acrylic resin, and liquid glass.

Figure 5B:
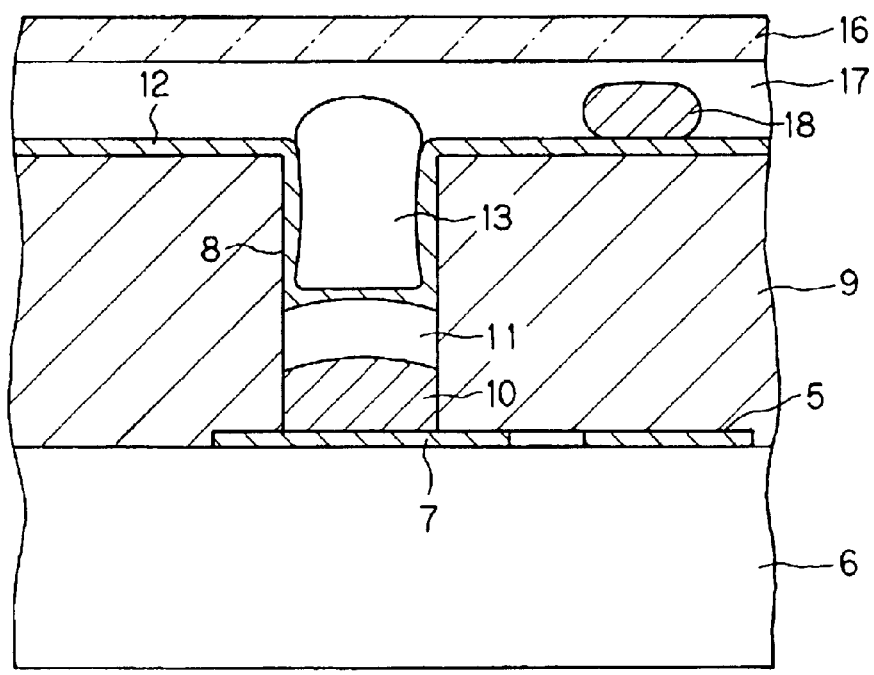

As shown in FIG. 5(b), the arrangement may be such that the substrate surface is hermetically covered with a cover glass 16 after the formation of the microlenses 13 or 14, and a gas 17, e.g. nitrogen, is sealed in the space defined inside the cover glass 16, and a drying agent 18 is put in the space.

Figure 6:
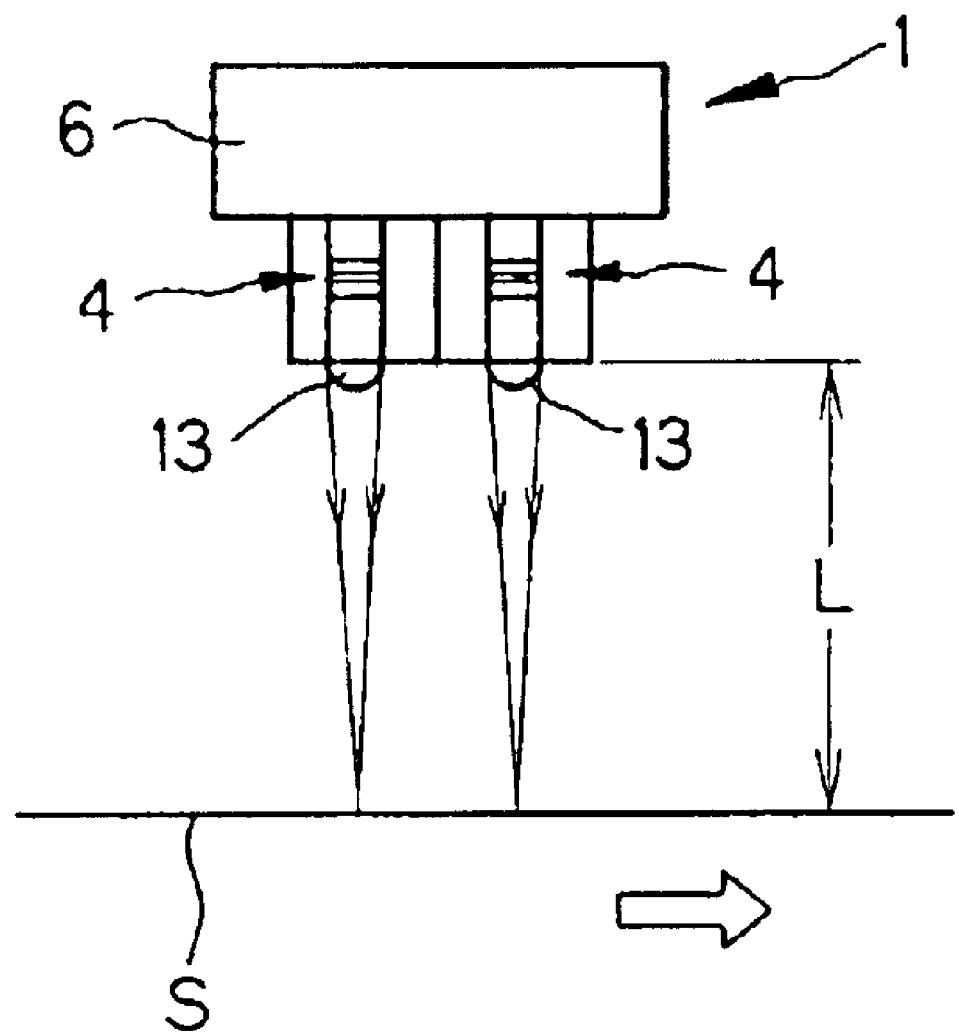
FIG. 6 is a sectional view showing the way in which light is collected by the organic EL array exposure head according to the present invention.

Thus, the organic EL array exposure head 1 according to the present invention has an array of organic EL light-emitting parts 4 provided on the substrate 6, together with an array of TFT's 5 for controlling light emission from the organic EL light-emitting parts 4. In addition, a convex microlens 13 with a predetermined focal length is formed over each organic EL light-emitting part 4 by ink-jet printing. As shown in FIG. 6, which is a side view thereof, the organic EL array exposure head 1 collects light beams emitted from the organic EL light-emitting parts 4 on a surface S a predetermined distance L away from the exposure head 1 in the same array pattern as that of the pixels 3 of the exposure head 1. Accordingly, a predetermined pattern can be recorded on the surface S by moving the surface S relative to the organic EL array exposure head 1 in a direction perpendicular to the longitudinal direction of the exposure head 1 and, at the same time, controlling the light emission from the organic EL light-emitting parts 4 of the exposure head 1 through the TFT's 5.

Figure 7:
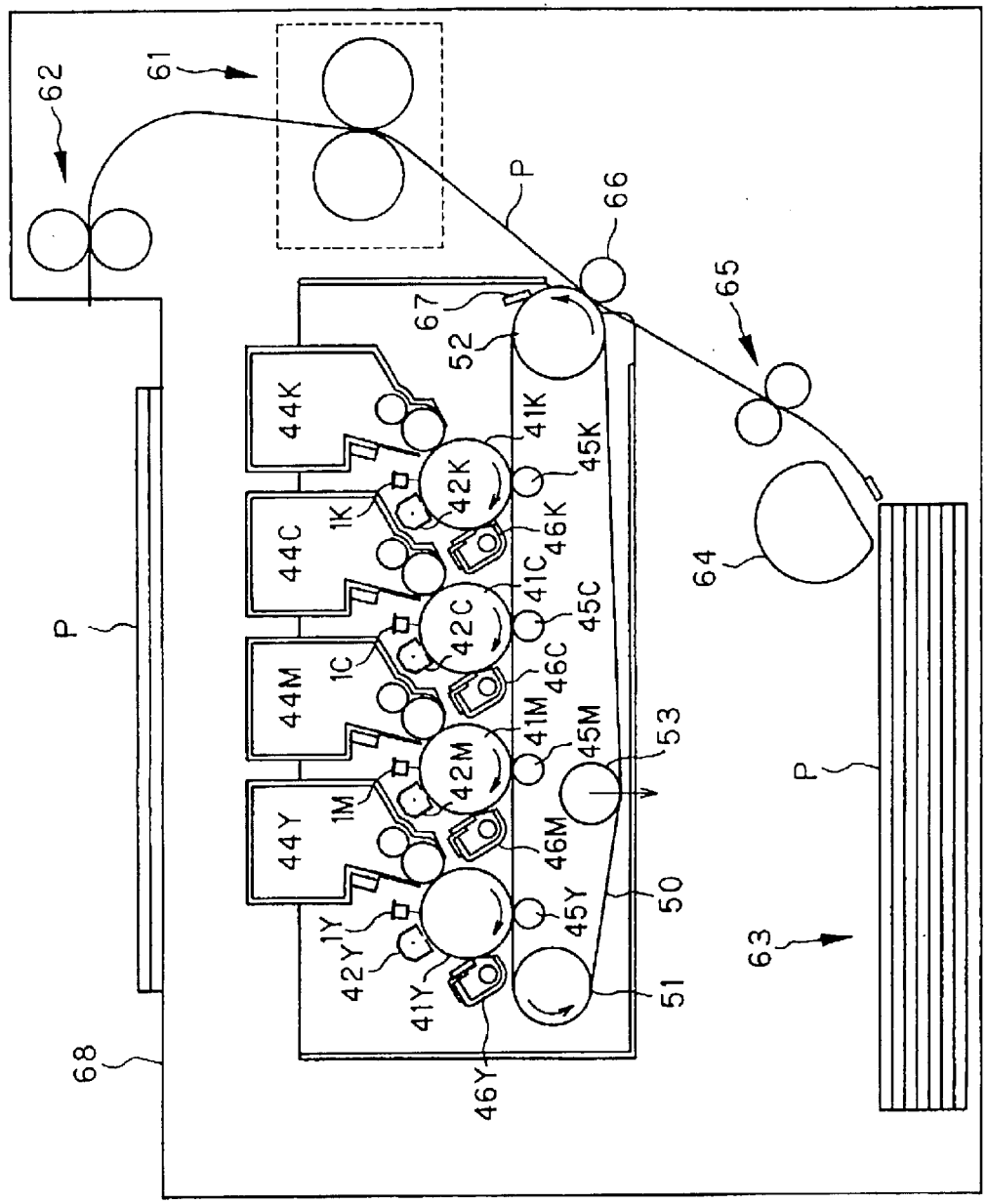
FIG. 7 is a front view schematically showing the general arrangement of an example of a tandem color image forming apparatus equipped with organic EL array exposure heads according to the present invention.

In the present invention, therefore, the organic EL array exposure head 1 of the present invention, arranged as stated above, is used as an exposure head of an electrophotographic color image forming apparatus, by way of example. FIG. 7 is a front view schematically showing the general arrangement of an example of a tandem color image forming apparatus in which four similar organic EL array exposure heads 1K, 1C, 1M and 1Y according to the present invention are disposed at the respective exposure positions of four similar photosensitive drums 41K, 41C, 41M and 41Y corresponding thereto. As shown in FIG. 7, the image forming apparatus has an intermediate transfer belt 50 stretched between a driving roller 51 and a driven roller 52 with tension applied thereto by a tension roller 53 and driven to circulate in the direction of the arrows shown in the figure (counterclockwise direction) by the driving roller 51. Four photosensitive members 41K, 41C, 41M and 41Y are disposed at predetermined spacings with respect to the intermediate transfer belt 50. Each photosensitive member has a photosensitive layer on the outer peripheral surface thereof to serve as an image carrier. Suffixes "K", "C", "M", and "Y" added to reference numeral 41 indicate black, cyan, magenta, and yellow, respectively. That is, the reference symbols denote photosensitive members for black, cyan, magenta, and yellow, respectively. The same is the case with other members. The photosensitive members 41K, 41C, 41M and 41Y are driven to rotate in the direction of the arrows shown in the figure (clockwise direction) synchronously with the driving of the intermediate transfer belt 50. Around each photosensitive member 41 (K, C, M, and Y), the following devices are provided: a charging device (corona charger) 42 (K, C, M, and Y) for uniformly electrically charging the outer peripheral surface of the photosensitive member 41 (K, C, M, and Y); an organic EL array exposure head 1 (K, C, M, and Y) with the above-described structure of the present invention for sequentially line-scanning the outer peripheral surface of the photosensitive member 41 (K, C, M, and Y), which has been uniformly electrically charged by the charging device 42 (K, C, M, and Y), synchronously with the rotation of the photosensitive member 41 (K, C, M, and Y); a developing device 44 (K, C, M, and Y) for applying toner as a developer to an electrostatic latent image formed on the organic EL array exposure head 1 (K, C, M, and Y) to produce a visible image (toner image); a primary transfer roller 45 (K, C, M, and Y) serving as transfer means for sequentially transferring the toner image developed by the developing device 44 (K, C, M, and Y) onto the intermediate transfer belt 50 serving as a primary transfer target; and a cleaning device 46 (K, C, M, and Y) as cleaning means for removing the toner remaining on the surface of the photosensitive member 41 (K, C, M, and Y) after the transfer of the toner image.

Each organic EL array exposure head 1 (K, C, M, and Y), as shown in FIG. 6, has a convex microlens 13 with a predetermined focal length formed over each organic EL light-emitting part 4 by ink-jet printing, and is installed at a predetermined distance L away from the surface of the associated photosensitive member 41 (K, C, M, and Y) in such a manner that the array direction of the organic EL array exposure head 1 (K, C, M, and Y) is parallel to the generator of the photosensitive member 41 (K, C, M, and Y). The emission energy peak wavelength of each organic EL array exposure head 1 and the sensitivity peak wavelength of the photosensitive member 41 (K, C, M, and Y) are set so as to be approximately coincident with each other.

The developing device 44 (K, C, M, and Y) uses a non-magnetic one-component toner as a developer, for example. The one-component developer is conveyed to a developing roller through a supply roller, for example, and the thickness of the developer layer adhering to the developing roller surface is regulated with a regulating blade. The developing roller is brought into contact with or pressed against the photosensitive member 41 (K, C, M, and Y) to allow the developer to adhere to the surface of the photosensitive member 41 (K, C, M, and Y) according to the electric potential level thereof, thereby developing the electrostatic latent image into a toner image.

Toner images of black, cyan, magenta and yellow formed by single-color toner image forming stations for the four colors are sequentially primarily transferred onto the intermediate transfer belt 50 by a primary transfer bias applied to each primary transfer roller 45 (K, C, M, and Y), and sequentially superimposed on one another on the intermediate transfer belt 50 to form a full-color toner image, which is then secondarily transferred onto a recording medium P, e.g. a sheet of paper, at a secondary transfer roller 66. The transferred full-color toner image is fixed on the recording medium P by passing between a pair of fixing rollers 61 constituting a fixing part. Then, the recording medium P is discharged through a pair of sheet delivery rollers 62 onto a sheet delivery tray 68 formed on the top of the apparatus body.

It should be noted that reference numeral 63 in FIG. 7 denotes a sheet cassette in which a stack of large number of recording media P is held. A pickup roller 64 feeds the recording media P from the sheet cassette 63 one by one. A pair of gate rollers 65 regulates the timing at which each recording medium P is supplied to the secondary transfer part formed between the secondary transfer roller (secondary transfer means) 66 and the intermediate transfer belt 50. A cleaning blade 67 serves as cleaning means for removing the toner remaining on the surface of the intermediate transfer belt 50 after the secondary transfer.

Figure 8:
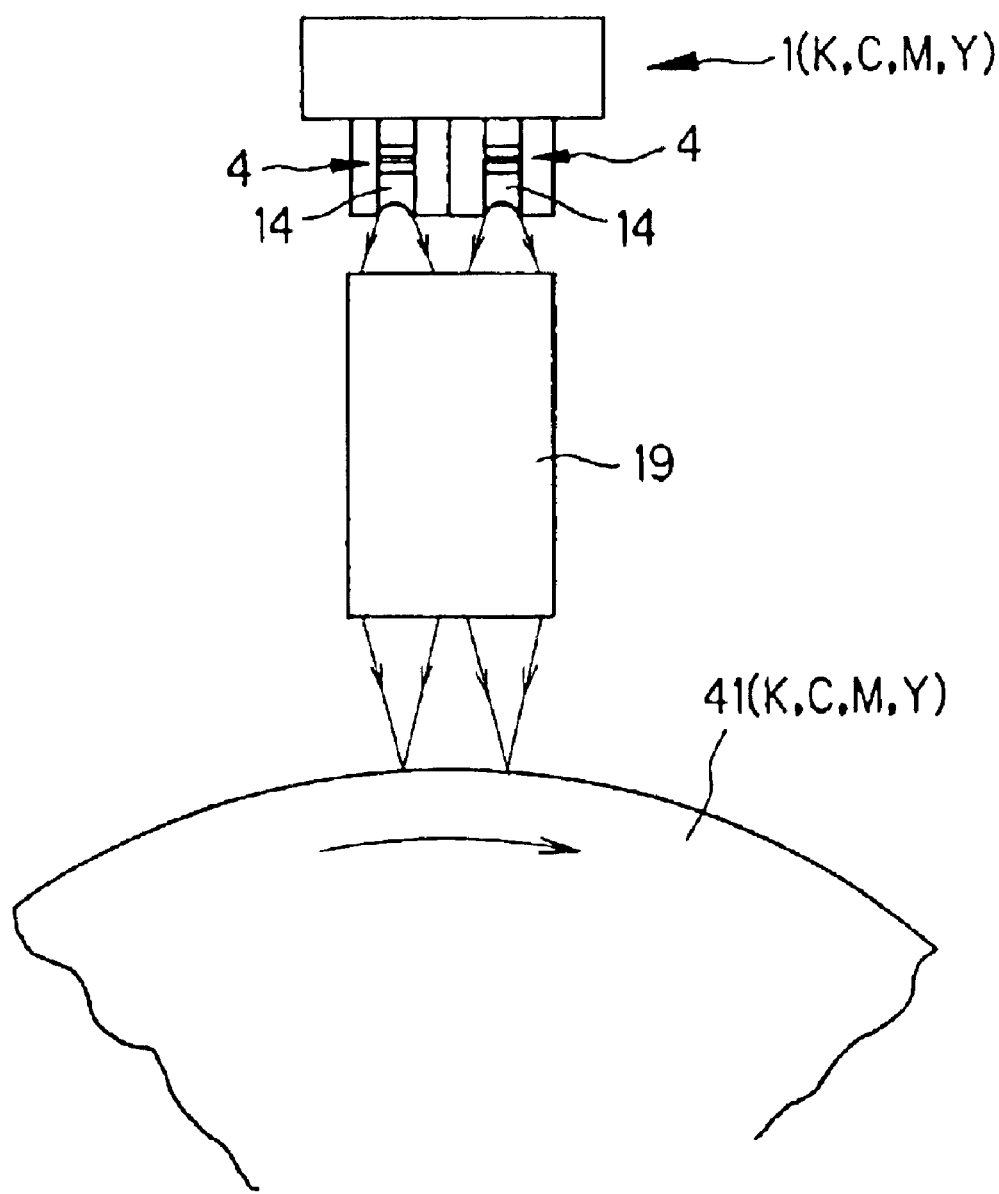
FIG. 8 is a diagram showing an example in which an image-forming optical system comprising a converging rod lens array is disposed between an organic EL array exposure head and a photosensitive drum.

It should be noted that the organic EL array exposure head 1 (K, C, M, and Y) used in the apparatus shown in FIG. 7 has a convex microlens 13 with a predetermined focal length formed over each organic EL light-emitting part 4 by ink-jet printing, as shown in FIG. 2. However, the image forming apparatus may use organic EL array exposure heads having a concave microlens 14 formed over each organic EL light-emitting part 4, as shown in FIG. 4. When the organic EL array exposure head 1 (K, C, M, and Y) having the concave microlenses 14 is used, or in a case where the convex microlenses 13 are used, but the above-described spacing distance L is short, it is desirable that, as shown in FIG. 8, an image-forming optical system 19 comprising a converging rod lens array, for example, should be disposed between the organic EL array exposure head 1 (K, C, M, and Y) and the photosensitive member 41 (K, C, M, and Y).

Although the organic EL array exposure head according to the present invention and the fabrication method therefor, together with the image forming apparatus using the same, have been described above by way of embodiments, it should be noted that the present invention is not limited to the foregoing embodiments but can be modified in a variety of ways.

As will be clear from the foregoing description, the organic EL array exposure head according to the present invention has an array of organic EL light-emitting parts arranged in the form of at least one row of pixels on a substrate of continuous length. The organic EL array exposure head further has a microlens formed by ink-jet printing over a surface of each organic EL light-emitting part at a side thereof remote from the substrate. Accordingly, it is possible to readily provide a low-cost exposure head for use in electrophotographic printers, etc. that suffers minimal unevenness of exposure and has a simplified arrangement requiring no separate optical system.

What we claim is:

1. An organic EL array exposure head comprising:
   an array of organic EL light-emitting parts arranged in a form of at least one row of pixels on a substrate of continuous length; and
   a microlens formed by ink-jet printing over a surface of each organic EL light-emitting part at a side thereof remote from said substrate;
   wherein said organic EL light-emitting parts are formed in respective discrete holes divided from each other by a partition wall provided on said substrate, and said microlens is formed over each of said organic EL light-emitting parts in said holes.

2. An organic EL array exposure head according to claim 1, wherein a thin-film electronic circuit for controlling light emission from said organic EL light-emitting parts is formed on said substrate, and said organic EL light-emitting parts are provided over said thin-film electronic circuit.

3. The organic EL array exposure head according to claim 1, wherein said organic EL light-emitting parts each comprise an organic light-emitting layer and a hole injection layer, said organic light-emitting layer and hole injection layer being formed by ink-jet printing.

4. The organic EL array exposure head according to claim 1, wherein said microlens is a convex lens.

5. An image forming apparatus having said organic EL array exposure head according to any one of claims 1 to 4 as an exposure head for writing an image on an image carrier.

6. An image forming apparatus according to claim 5, which is a tandem color image forming apparatus including at least two image forming stations each having electric charging means, an exposure head, developing means, and transfer means around an image carrier, wherein a transfer medium passes through said stations to perform color image formation.

7. The organic EL array exposure head of claim 1, wherein the surface of each organic EL light-emitting part at a side thereof remote from said substrate is substantially water repellent so that a convex lens may be formed thereon as a microlens.

8. The organic EL array exposure head of claim 1, wherein the surface of each organic EL light-emitting part at a side thereof remote from said substrate is substantially hydrophilic so that a concave lens may be formed thereon as a microlens.

9. A method of fabricating an organic EL array exposure head, said method comprising the steps of:
   forming reflector electrodes in a form of at least one row of pixels on a substrate of continuous length, each of said reflector electrodes constituting one electrode of each organic EL light-emitting part;
   forming a partition wall of a predetermined height over said reflector electrodes, said partition wall having discrete holes corresponding to said reflector electrodes;
   forming an organic light-emitting layer or a hole injection layer constituting each organic EL light-emitting part in each of said holes in said partition wall by ink-jet printing;
   forming a hole injection layer or an organic light-emitting layer constituting each organic EL light-emitting part in each of said holes in said partition wall by ink-jet printing;
   forming a transparent electrode uniformly over a surface of said substrate as the other electrode of each organic EL light-emitting part; and
   forming a microlens over said transparent electrode in each of said holes in said partition wall by ink-jet printing.

10. A method of fabricating an organic EL array exposure head according to claim 9, wherein after said transparent electrode has been formed, a surface thereof is treated to be water repellent so that a convex lens is formed thereon as a microlens.

11. A method of fabricating an organic EL array exposure head according to claim 9, wherein after said transparent electrode has been formed, a surface thereof is treated to be hydrophilic so that a concave lens is formed thereon as a microlens.

12. A method of fabricating an organic EL array exposure head according to any one of claims 9 to 11, wherein prior to formation of said reflector electrodes, a thin-film electronic circuit for controlling light emission from said organic EL light-emitting parts is formed on said substrate.

13. The method of fabricating an organic EL array exposure head according to claim 9, wherein each of the reflector electrodes is a single layer metal film.

* * * * *